United States Patent [19]
Manning

[11] Patent Number: 5,700,733
[45] Date of Patent: Dec. 23, 1997

[54] SEMICONDUCTOR PROCESSING METHODS OF FORMING FIELD OXIDE REGIONS ON A SEMICONDUCTOR SUBSTRATE

[75] Inventor: Monte Manning, Boise, Id.

[73] Assignee: Micron Technology, Inc., Boise, Id.

[21] Appl. No.: 495,339

[22] Filed: Jun. 27, 1995

[51] Int. Cl.$^6$ .................................................. H01L 21/76
[52] U.S. Cl. ............................................. 438/439; 438/452
[58] Field of Search ................ 437/69, 70; 148/DIG. 85, 148/DIG. 86, DIG. 117

[56] References Cited

U.S. PATENT DOCUMENTS

| | | |
|---|---|---|
| 5,468,675 | 11/1995 | Kaigawa . |
| 5,567,645 | 10/1996 | Ahn et al. ................................. 437/72 |

FOREIGN PATENT DOCUMENTS

| | | |
|---|---|---|
| 2-30134 | 1/1990 | Japan . |
| 4-130630 | 5/1992 | Japan . |
| 4-162528 | 6/1992 | Japan . |
| 5-291243 | 11/1993 | Japan . |
| 6-333920 | 12/1994 | Japan . |

*Primary Examiner*—George R. Fourson
*Attorney, Agent, or Firm*—Wells, St. John, Roberts, Gregory & Matkin, P.S.

[57] ABSTRACT

A semiconductor processing method of forming field oxide regions on a semiconductor substrate includes, i) providing an oxidation resistant mask over a layer of oxide over a desired active area region on a semiconductor substrate, the mask having a central region and opposed sidewall edges, the oxide layer being thinner in the central region than at the sidewall edges; and ii) oxidizing portions of the substrate unmasked by the mask to form field oxide regions on the substrate. The oxidation resistant mask can be provided by depositing and patterning a nitride layer atop a pad oxide layer. Substrate area not covered the mask is oxidized to produce an oxide layer outside of the mask which is thicker than the pad oxide layer. A thin layer of nitride can then be deposited, and anisotropically etched to produce masking spacers which cover the thicker oxide adjacent the original mask. Mask lifting during subsequent oxidation is restricted, thus minimizing bird's beak encroachment and substrate defects.

9 Claims, 2 Drawing Sheets

SEMICONDUCTOR PROCESSING METHODS OF FORMING FIELD OXIDE REGIONS ON A SEMICONDUCTOR SUBSTRATE

PATENT RIGHTS STATEMENT

This invention was made with Government support under Contract No. MDA972-92-C-0054 awarded by Advanced Research Projects Agency (ARPA). The Government has certain rights to this invention.

TECHNICAL FIELD

This invention relates to semiconductor processing methods of forming field oxide regions on semiconductor substrates.

BACKGROUND OF THE INVENTION

The reduction in memory cell and other circuit size required for high density dynamic random access memories (DRAMs) and other circuitry is a continuing goal in semiconductor fabrication. Implementing electric circuits involves connecting isolated devices through specific electric paths. When fabricating silicon and other material into integrated circuits, it is necessary to isolate devices built into the substrate from one another. Electrical isolation of devices as circuit density increases is a continuing challenge.

One method of isolating devices involves the formation of a semi-recessed or fully recessed oxide in the nonactive (or field) area of the substrate. These regions are typically termed as "field oxide" and are formed by LOCal Oxidation of exposed Silicon, commonly known as LOCOS. One approach in forming such oxide is to cover the active regions with a thin layer of silicon nitride that prevents oxidation from occurring therebeneath. A thin intervening layer of a sacrificial pad oxide is provided intermediate the silicon substrate and nitride layer to alleviate stress and protect the substrate from damage during subsequent removal of the nitride layer. The unmasked or exposed field regions of the substrate are then subjected to a wet $H_2O$ oxidation, typically at atmospheric pressure and at temperatures of around 1000° C., for two to four hours. This results in field oxide growth where there is no masking nitride.

However at the edges of the nitride, some oxidant also diffuses laterally. This causes the oxide to grow under and lift the nitride edges. Because the shape of the oxide at the nitride edges is that of a slowly tapering oxide wedge that merges into another previously formed layer of oxide, it has commonly been referred to as a "bird's beak". The bird's beak is a lateral extension or encroachment of the field oxide into the active areas where the devices are formed. Although the length of the bird's beak depends upon a number of parameters, the length is typically 0.15 micron–0.5 micron per side.

This thinner area of oxide resulting from the bird's beak provides the disadvantage of not providing effective isolation in these regions, and as well unnecessarily consumes precious real estate on the semiconductor wafer. Further, as the circuit density (commonly referred to as minimum device pitch) falls below 1.0 micron, conventional LOCOS techniques fail due to excessive encroachment of the oxide beneath the masking stack. The closeness of the masking block stacks in such instances results in effective joining of adjacent bird's beaks, thus effectively lifting the stacks and resulting in no masking effect to the oxidation. Bird's beaks encroachment can be minimized by making the masking nitride layer atop the oxide layer as thick as practical and/or making the pad oxide as thin as possible. However undesirably, thick nitride layers and/or thin pad oxide layers result in considerable stress being induced into the silicon substrate during oxidation.

It would be desirable to develop improved techniques for forming field oxidation regions.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of forming field oxide regions on a semiconductor substrate comprises the following steps:

providing a pad oxide layer over a semiconductor substrate to a first thickness;

providing a patterned mask of a masking material over the pad oxide layer over a desired active area region of the substrate, the patterned mask having opposed sidewall edges;

providing unmasked oxide relative to the substrate externally adjacent the mask sidewall edges, the unmasked oxide being provided to a second thickness which is greater than the first thickness;

providing sidewall spacers laterally over the patterned mask sidewall edges and elevationally over the unmasked oxide layer, the sidewall spacers comprising the masking material; and oxidizing portions of the substrate unmasked by the patterned mask to form field oxide regions on the substrate.

In accordance with another aspect of the invention, a semiconductor processing method of forming field oxide regions on a semiconductor substrate comprises the following steps:

providing an oxidation resistant mask over a layer of oxide over a desired active area region on a semiconductor substrate, the mask having a central region and opposed sidewall edges, the oxide layer being thinner in the central region than at the sidewall edges; and oxidizing portions of the substrate unmasked by the mask to form field oxide regions on the substrate.

In accordance with still a further aspect of the invention, a semiconductor processing method of forming field oxide regions on a semiconductor substrate comprises the following steps:

provㅤiding an oxidation resistant mask over a layer of oxide over a desired active area region on a semiconductor substrate, the mask having a central region and opposed sidewall edges, the oxide layer extending outwardly of the mask, the oxide layer having a first thickness in the central region and a second thickness at the sidewall edges, the mask being provided to a maximum third thickness, the first thickness being less than the second thickness to present a ratio of the third thickness to the second thickness which is less than a ratio of the third thickness to the first thickness; and oxidizing portions of the substrate unmasked by the mask to form field oxide regions on the substrate.

These and other aspects of the invention will be more fully appreciated from the following description of preferred embodiments, with reference to the figures.

Figure 1:
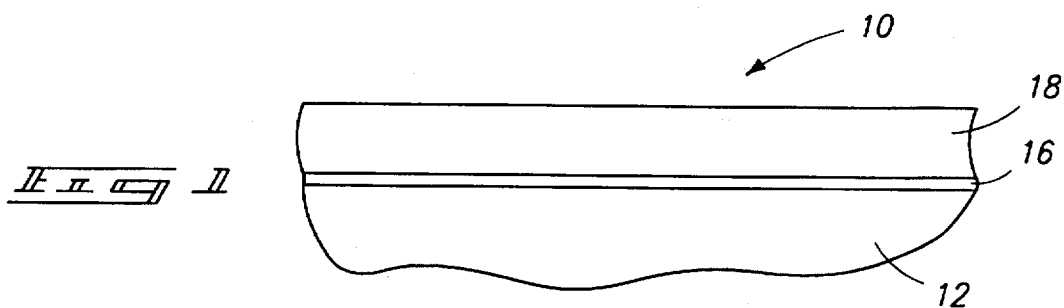
FIG. 1 is a diagrammatic sectional view of a semiconductor wafer fragment at one processing step in accordance with the invention.

FIG. 1 illustrates a semiconductor wafer fragment in process indicated generally by reference numeral 10. Fragment 10 comprises a bulk substrate 12, typically and preferably comprising monocrystalline silicon. A pad oxide layer 16 is provided over substrate 12 to a first thickness of from 80 Angstroms to 150 Angstroms. A layer 18 of a masking material, preferably $Si_3N_4$, is provided over pad oxide layer 16 to a preferred thickness of from 2500 Angstroms to 3500 Angstroms.

Figure 2:
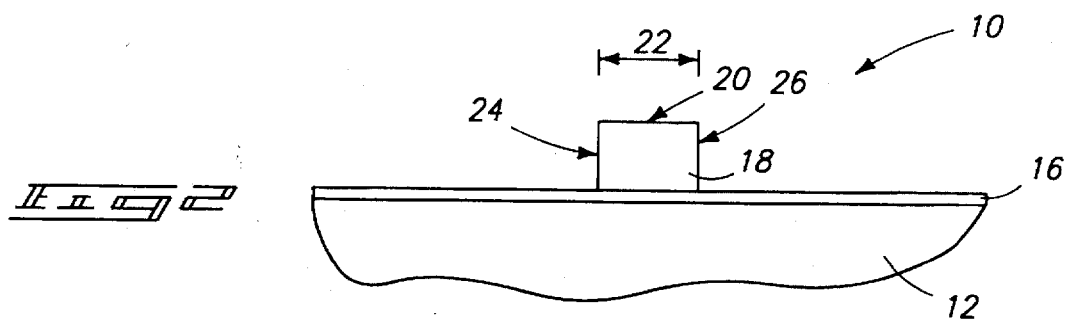
FIG. 2 is a view of the FIG. 1 wafer fragment at a processing step subsequent to that shown by FIG. 1.

Referring to FIG. 2, layer 18 is patterned, typically with photoresist, to produce a mask or masking block 20 over pad oxide layer 16 to mask an example active area region 22 of the substrate. For purposes of the continuing discussion, patterned mask 20 includes opposed lateral sidewall edges 24 and 26.

Figure 3:
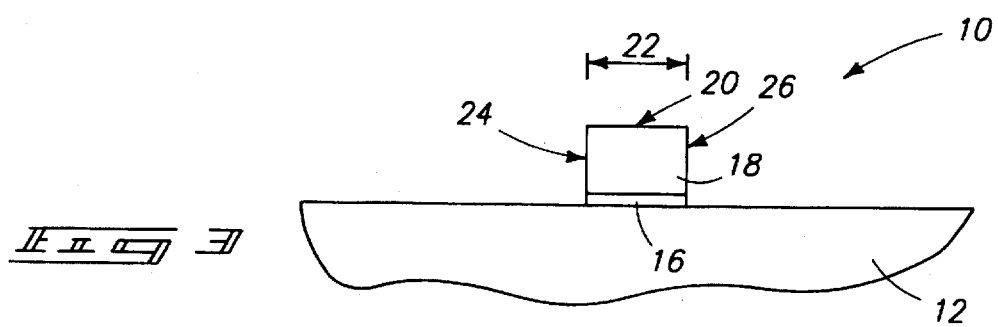
FIG. 3 is a view of the FIG. 1 wafer fragment at a processing step subsequent to that shown by FIG. 2.

Referring to FIG. 3, pad oxide layer 16 not covered by patterned mask 20, and which initially extends outwardly beyond mask sidewall edges 24 and 26, is stripped from substrate 12.

Figure 4:
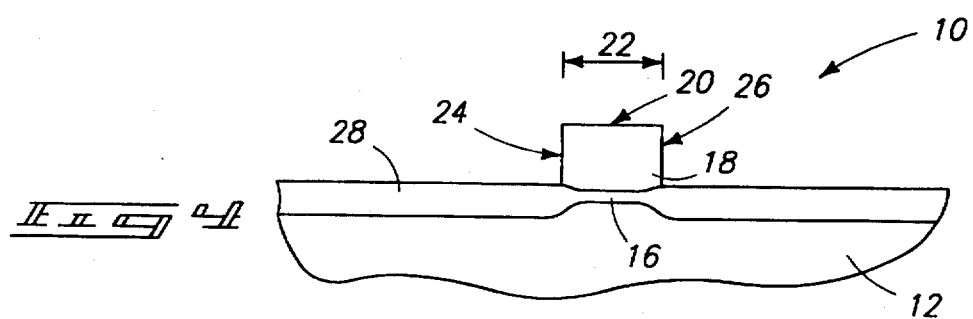
FIG. 4 is a view of the FIG. 1 wafer fragment at a processing step subsequent to that shown by FIG. 3.

Referring to FIG. 4, the wafer is exposed to oxidizing conditions effective to grow a layer 28 comprising unmasked oxide from semiconductor substrate 12 externally adjacent mask sidewall edges 24 and 26. Unmasked oxide layer 28 is provided to a second thickness which is greater than the first thickness of oxide layer 16. An example preferred thickness is from 200 Angstroms to 300 Angstroms. Pad oxide layer 16 and unmasked oxide layer 28 join together, as shown.

Unmasked oxide layer 28 could of course be provided by alternate techniques. For example, the unmasked pad oxide strip as depicted by FIG. 3 could be eliminated, with oxidation of the wafer as appearing in FIG. 2 being conducted to desirably grow layer 28. Preferably, however, layer 16 is stripped as shown in FIG. 3 to provide a base starting point for growing a more precise desired thickness for layer 28. The nitride etch to produce the construction of FIG. 2 can remove a significant portion of oxide layer 16 due to the thinness of such layer. Further alternately, an unmasked oxide layer 28 might be provided by an oxide deposition process as opposed to the preferred oxide growth process.

Figure 5:
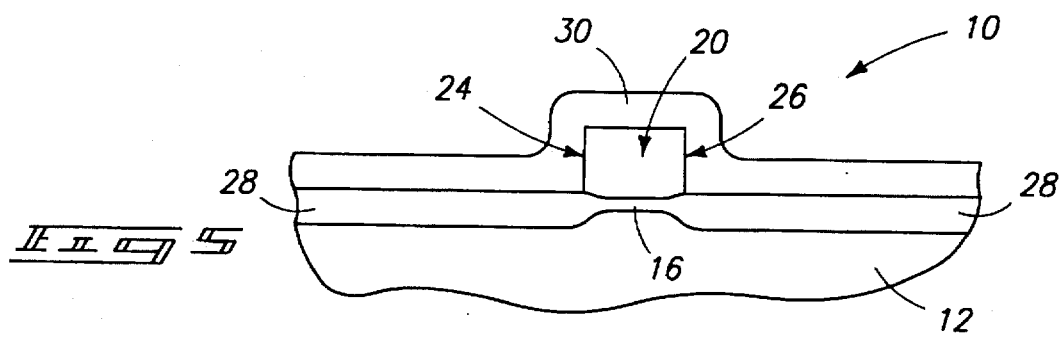
FIG. 5 is a view of the FIG. 1 wafer fragment at a processing step subsequent to that shown by FIG. 4.

Referring to FIG. 5, a layer 30 of the masking material of mask 20 is deposited over patterned mask 20 and unmasked oxide layer 28 to a thickness of from 700 Angstroms to 1500 Angstroms.

Figure 6:
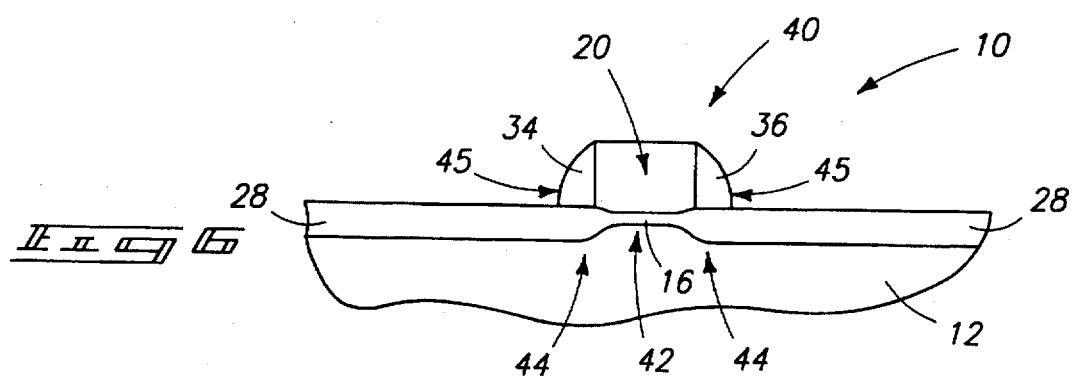
FIG. 6 is a view of the FIG. 1 wafer fragment at a processing step subsequent to that shown by FIG. 5.

Referring to FIG. 6, layer 30 is anisotropically etched selectively relative to underlying oxide layer 28 to provide sidewall spacers 34 and 36 over patterned mask sidewall edges 24 and 26, respectively, and elevationally over unmasked oxide layer 28. Thus, sidewall spacers 34 and 36 will have respective widths at their widest points of from 700 Angstroms to 1500 Angstroms, depending upon the deposition thickness of layer 30, where they join with oxide layer 28. As an alternate but less preferred process sequence, an etch stop layer can be provided atop mask 20 prior to provision of layer 30. Such could be utilized to prevent any etching of mask 20 during the anisotropic etch.

Collectively, sidewall spacers 34 and 36, and masking block 20, constitute an oxidation resistant mask 40 provided over a layer of oxide 16 and 28 over a desired active area region of a semiconductor substrate. Mask 40 includes outer lateral sidewall edges 45, with the joined oxide of oxide layers 16 and 28 oxide layer extending outwardly therefrom. In the described and preferred embodiment, the oxide of layers 16 and 28 are discretely and separately provided, and joined beneath oxidation resistant mask 40.

Oxidation resistant mask 40 defines a central masked region 42 and peripheral masked regions 44. Oxide layer 16/28 is thus thinner in central region 42 than at peripheral regions 44 adjacent sidewall edges 45. Oxide layer 16/28 extends outwardly of oxidation resistant mask 40. Oxide layer 16/28 can be considered as having a first thickness in central region 42 and a larger second thickness in peripheral region 44. Similarly, oxidation resistant mask 40 can be considered as having a third thickness which presents a ratio of the third thickness to the second thickness which is less than a ratio of the third thickness to the first thickness. A preferred ratio of the third thickness to the first thickness is from 20:1 to 25:1, with the ratio of the third thickness to the second thickness preferably being less than or equal to 15:1, and most preferably less than or equal to 13:1.

Figure 7:
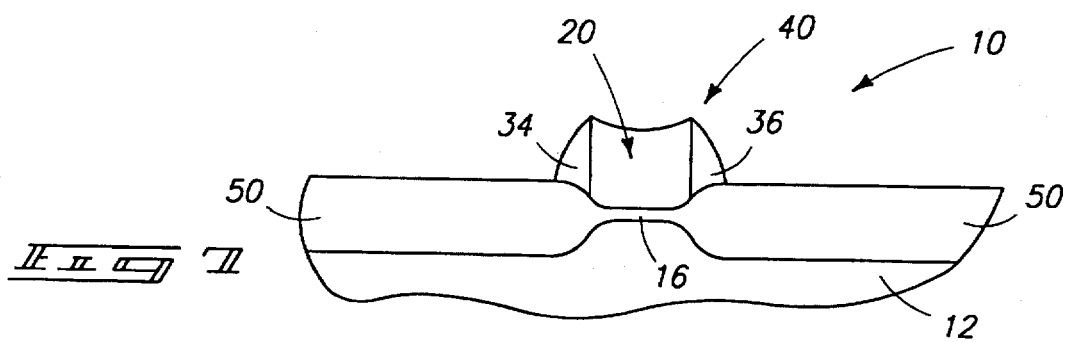
FIG. 7 is a view of the FIG. 1 wafer fragment at a processing step subsequent to that shown by FIG. 6.

Referring to FIG. 7, the wafer is subjected to oxidizing conditions to oxidize portions of the substrate unmasked by oxidation resistant mask 40 to form field oxide regions 50 on the substrate. Example oxidation conditions include exposing the wafer at 950° C. to a steam atmosphere. The described construction provides a nitride to pad oxide ratio at the edges of the nitride mask which is lower than at the center. Accordingly, a reduced stress gradient is presented in the bulk silicon at the edges of the nitride pattern during oxidation, thus alleviating stress and restricting prior art lifting of the mask from the substrate.

The above process is believed to be simpler than prior art anti-encroachment techniques, such as poly buffered LOCOS and ONO poly buffered LOCOS. In comparison, the described process includes two fewer furnace and four fewer wet etches at the expense of, i) an added dry etch; and ii) simpler post removal of the field oxidation mask, since no wet poly etch is required and therefore little risk of silicon substrate damage.

A sequence of multiple layers 30 and spacers might also be provided instead of a single layer and single anisotropic etch, but is not preferred due to added process complexity.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A semiconductor processing method of forming field oxide regions on a semiconductor substrate, the method comprising the following steps:

forming a pad oxide layer over a semiconductor substrate to a first thickness;

forming a patterned mask of a masking material over the pad oxide layer, the patterned mask having opposed sidewall edges;

forming unmasked oxide relative to the substrate externally proximate the mask sidewall edges, the unmasked oxide being provided to a second thickness which is greater than the first thickness, the forming of the unmasked oxide comprising depositing a layer of oxide over the semiconductor substrate;

forming sidewall spacers laterally over the patterned mask sidewall edges and elevationally over the unmasked oxide layer, the sidewall spacers comprising the masking material; and oxidizing portions of the substrate unmasked by the patterned mask and sidewall spacers to form field oxide regions on the substrate.

2. A semiconductor processing method of forming field oxide regions on a semiconductor substrate, the method comprising the following steps:

forming a pad oxide layer over a semiconductor substrate to a first thickness;

forming a patterned mask of a masking material over the pad oxide layer, the patterned mask having opposed sidewall edges;

forming unmasked oxide relative to the substrate externally proximate the mask sidewall edges, the unmasked oxide being provided to a second thickness which is greater than the first thickness;

forming sidewall spacers laterally over the patterned mask sidewall edges and elevationally over the unmasked oxide layer, the sidewall spacers comprising the masking material; and oxidizing portions of the substrate unmasked by the patterned mask and sidewall spacers to form field oxide regions on the substrate; wherein the pad oxide layer and the unmasked oxide are discretely provided layers, the pad oxide layer initially extending outwardly beyond the mask sidewall edges, the pad oxide not covered by the patterned mask being stripped from the substrate prior to providing the discretely provided unmasked oxide layer, the step of providing the unmasked oxide comprising depositing a layer of oxide over the semiconductor substrate.

3. The semiconductor processing method of forming field oxide regions of claim 1 wherein the sidewall spacers are formed to widths of from 700 Angstroms to 1500 Angstroms.

4. The semiconductor processing method of forming field oxide regions of claim 1 wherein the first thickness is from 80 Angstroms to 150 Angstroms, and the second thickness is from 200 Angstroms to 300 Angstroms.

5. The semiconductor processing method of forming field oxide regions of claim 1 wherein the first thickness is from 80 Angstroms to 150 Angstroms, the second thickness is from 200 Angstroms to 300 Angstroms, and the sidewall spacers are formed to respective widths of from 700 Angstroms to 1500 Angstroms.

6. The semiconductor processing method of forming field oxide regions of claim 1 wherein the first thickness is from 80 Angstroms to 150 Angstroms, the second thickness is from 200 Angstroms to 300 Angstroms, the sidewall spacers are formed to respective widths of from 700 Angstroms to 1500 Angstroms, and the patterned mask has a thickness of from 2500 Angstroms to 3500 Angstroms.

7. The semiconductor processing method of forming field oxide regions of claim 1 wherein the forming of the sidewall spacers comprises:

forming a layer of the masking material over the patterned mask and the unmasked oxide layer; and anisotropically etching the masking material layer to form the sidewall spacers.

8. The semiconductor processing method of forming field oxide regions of claim 1 wherein the pad oxide and unmasked oxide are in contact prior to the oxidizing step.

9. The semiconductor processing method of forming field oxide regions of claim 1 wherein the forming of the sidewall spacers comprises:

forming a layer of the masking material over the patterned mask and the unmasked oxide layer;

anisotropically etching the masking material layer to form the sidewall spacers; and wherein, the pad oxide and unmasked oxide are in contact prior to the oxidizing step.

* * * * *